United States Patent [19]

Yamazaki et al.

[11] Patent Number: 5,451,952
[45] Date of Patent: Sep. 19, 1995

[54] CMOS FLASH ANALOG-TO-DIGITAL CONVERTER WITH HYSTERESIS

[75] Inventors: Seiichi Yamazaki; Mitsuya Ohie; Yasuhiro Shin, all of Tokyo, Japan

[73] Assignee: Oki Electric Industry Co., Ltd., Tokyo, Japan

[21] Appl. No.: 107,069

[22] Filed: Aug. 17, 1993

[30] Foreign Application Priority Data

Aug. 20, 1992 [JP] Japan .................................. 4-221451

[51] Int. Cl.$^6$ ................................................. H03M 1/34
[52] U.S. Cl. .................................. 341/158; 341/156; 341/159
[58] Field of Search ................... 341/156, 158, 159; 307/290, 360, 363; 327/205, 74, 80

[56] References Cited

U.S. PATENT DOCUMENTS

| | | | |
|---|---|---|---|
| 4,539,489 | 9/1985 | Vaughn | 307/290 |
| 4,547,763 | 10/1985 | Flamm | 341/159 |
| 4,859,873 | 8/1989 | O'Shaughnessy et al. | 307/290 |
| 5,341,033 | 8/1994 | Koker | 307/290 |

FOREIGN PATENT DOCUMENTS

| | | |
|---|---|---|
| 52-98456 | 8/1977 | Japan . |
| 59-104827 | 6/1984 | Japan . |
| 2-16809 | 1/1990 | Japan . |

OTHER PUBLICATIONS

"Introduction to MOS LSI Design", Mavor et al. pp. 185–186.
"Monolithic Expandable 6 Bit 20 MHz CMOS/SOS A/D Converter," Dingwall, pp. 926–929, IEEE Journal of Solid-State Circuits, vol. SC-14, No. 6, Dec., 1979.
"Analysis of Reference Tap Voltage Variations in a Flash A/D Converter," Nakaya et al., The Transactions of the Institute of Electronics and Communication Engineers of Japan, vol. J69-C, No. 3, Mar. 1986, pp. 237–238.

*Primary Examiner*—Howard L. Williams
*Attorney, Agent, or Firm*—Spencer, Frank & Schneider

[57] ABSTRACT

A flash analog-to-digital converter has CMOS comparators that compare an analog input signal with internal reference voltages and produce internal output signals. Each comparison is performed according to the threshold voltage of an inverter. A threshold control circuit in each comparator adjusts this threshold voltage according to the internal output signal, thereby providing hysteresis. A logic circuit receives the internal output signals from all the comparators and generates a digital output signal. The hysteresis of the comparators keeps the digital output signal from oscillating between adjacent values when the analog input signal is near one of the internal reference voltages.

4 Claims, 6 Drawing Sheets

CMOS FLASH ANALOG-TO-DIGITAL CONVERTER WITH HYSTERESIS

BACKGROUND OF THE INVENTION

This invention relates to a parallel analog-to-digital converter (commonly referred to as a flash A/D converter), more particularly to the comparator circuits of a flash A/D converter of the complimentary metal-oxide-semiconductor (CMOS) type.

A flash A/D converter converts an analog input signal to a digital output value by simultaneously comparing the input signal with a plurality of reference voltages, using a plurality of comparators. Because of their high speed, flash A/D converters are widely employed in video and radar equipment and laboratory instruments. CMOS flash A/D converters offer the additional advantages of compact size and low power dissipation, enabling the A/D converter to be fabricated as a monolithic integrated circuit.

A problem with existing CMOS flash A/D converters is that when the input signal is near one of the reference voltages, the output of the corresponding comparator tends to oscillate between the logic zero and one levels. This causes an instability of one least significant bit (LSB) in the output of the A/D converter; when the analog input signal is near the transition point between two adjacent digital values, the digital output signal tends to oscillate between those values. If the digital output signal is used to drive a display device, the result is an annoying flicker effect.

SUMMARY OF THE INVENTION

It is accordingly an object of the present invention to eliminate LSB instability from the output of a CMOS flash A/D converter.

The invented A/D converter receives an analog input signal and an external reference voltage, and divides the external reference voltage to generate a plurality of internal reference voltages. The analog input signal is compared with each internal reference voltage by a CMOS comparator to produce an internal output signal. Each comparison is performed according to the threshold voltage of an inverter. Each comparator has a threshold control circuit for adjusting this threshold voltage according to the internal output signal, thereby providing a hysteresis effect. A logic circuit receives the internal output signals from all the comparators and generates a digital output signal.

DETAILED DESCRIPTION OF THE INVENTION

Embodiments of the invention will now be described with reference to the attached drawings. These drawings illustrate the invention but do not restrict its scope, which should be determined solely from the appended claims.

Figure 1:
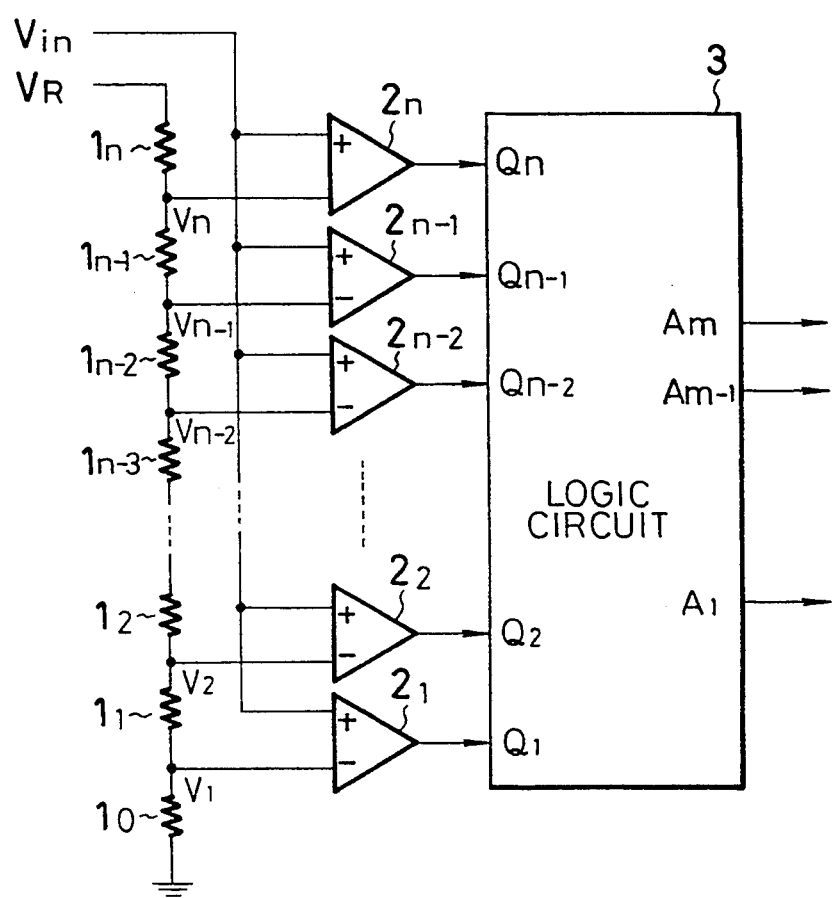
FIG. 1 is a general schematic diagram of the invented A/D converter.

Referring to FIG. 1, a flash A/D converter divides an externally supplied reference voltage $V_R$ by means of a resistor ladder comprising n+1 resistors $1_0 \ldots, 1_n$, where n is an integer of the form $2^m - 1$. For an eight-bit flash A/D converter, m is eight and n is two-hundred fifty-five. In general, m can be any positive integer. The voltages at the taps between the resistors, denoted $V_1, \ldots, V_n$, are related as follows:

$$0 < V_1 < V_2 < \ldots < V_{n-1} < V_n < V_R$$

These voltages $V_1, \ldots, V_n$ are supplied as internal reference voltages to n CMOS comparators $2_1, \ldots, 2_n$. Comparator $2_i$ compares internal reference voltage $V_i$ with the analog input signal $V_{in}$, and generates an output signal $Q_i$ (i=1, ..., n). Basically, $Q_i$ is a digital signal having the logic one level if $V_{in}$ is higher than $V_i$ and the logic zero level if $V_{in}$ is lower than $V_i$. If $V_{in}$ is between $V_{k-1}$ and $V_k$, then $Q_1$ to $Q_{k-1}$ are generally logic zero while $Q_k$ to $Q_n$ are generally logic one.

A logic circuit 3 receives the n outputs $Q_1, \ldots, Q_n$ of the comparators and converts them to an m-bit digital output signal, comprising bits $A_1$ to $A_m$, which expresses the voltage value of $V_{in}$. For example, $A_1$ to $A_m$ may express the value of the above-mentioned subscript k in binary form. Details of the logic circuit 3 will be omitted, as they will be familiar to those skilled in the art.

Figure 2:
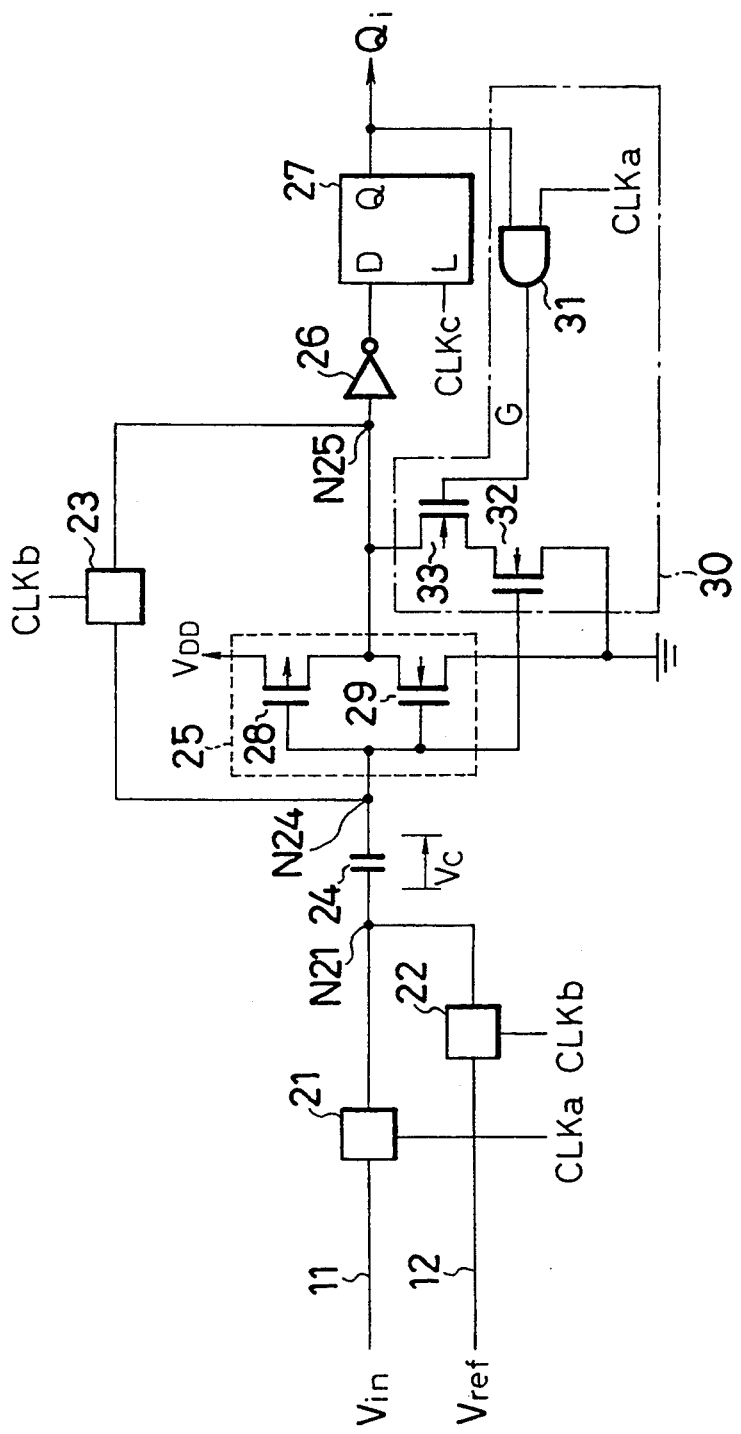
FIG. 2 is a more detailed diagram showing the novel circuit structure of the comparators in FIG. 1.

FIG. 2 shows the structure of the CMOS comparator $2_i$ (i=1, ..., n). The internal reference voltage $V_i$ is renamed $V_{ref}$ in this drawing to avoid confusion with $V_{in}$. The comparator comprises analog switches 21, 22, and 23, a capacitor 24, a pair of inverters 25 and 26, and a latch 27. The analog switches 21, 22, and 23 are controlled by a pair of complementary clock signals CLKa and CLKb. The latch 27 is controlled by a clock signal CLKc which is synchronized to CLKa.

The first analog switch 21 couples the input signal $V_{in}$ to a signal node N21. The second analog switch 22 couples the reference voltage $V_{ref}$ to the same node N21. The third analog switch 23 couples the input node N24 of the first inverter 25 to the output node N25 of the same inverter 25. When CLKa is high and CLKb is low, the first analog switch 21 is on and the other analog switches 22 and 23 are off. When CLKa is low and CLKb is high, the first analog switch 21 is off and the other analog switches 22 and 23 are on.

Here and elsewhere in the descriptions, where signals and logic levels are referred to, the term "high" is equivalent to "logic one," and "low" to "logic zero."

The capacitor 24 is coupled between the signal node N21 and the input node N24 of the first inverter 25. The first inverter 25 is a standard CMOS inverter comprising a first pull-up transistor 28 and a first pull-down transistor 29. These are coupled in series between a power supply node $V_{DD}$ and a ground node, indicated by the conventional ground symbol. The first pull-up transistor 28 is a p-channel metal-oxide-semiconductor field-effect transistor (hereinafter, PMOS transistor). The first pull-down transistor 29 is an n-channel metaloxide-semiconductor field-effect transistor (hereinafter, NMOS transistor). The gate electrodes of both transistors 28 and 29 are coupled to the input node N24. The output node N25 is coupled to a point between the two transistors 28 and 29.

The second inverter 26 has a similar structure, its input node being node N25 and its output node being the data (D) input of the latch 27.

The latch 27 is a well-known circuit having two input nodes D and L and an output node Q. The clock signal CLKc is input at node L. When CLKc is high, the output at node Q has the same logic level as the input at node D. When CLKc goes low, the logic level currently being output at node Q is latched, and node Q remains at that logic level until CLKc goes high again. The signal $Q_i$ output from node Q is one of the signals $Q_1, \ldots, Q_n$ shown in FIG. 1.

The comparator in FIG. 2 also has a threshold control circuit 30, which is a novel feature of the present invention. The threshold control circuit 30 comprises a two-input AND gate 31, a second pull-down transistor 32, and a switching transistor 33. Transistors 32 and 33 are both NMOS transistors.

The two inputs to the AND gate 31 are the signal $Q_i$ from the latch 27 and the clock signal CLKa. The gate signal G output from the AND gate 31 drives the gate electrode of the switching transistor 33. The second pull-down transistor 32 and switching transistor 33 are coupled in series between the output node N25 of the inverter 25 and ground. The gate electrode of the second pull-down transistor 32 is coupled to the input node N24 of the inverter 25.

Next the operation of the capacitor 24 and first inverter 25 in FIG. 2 will be described for three cases: (1) when CLKa is low, (2) when CLKa is high and $Q_i$ is low, and (3) when CLKa is high and $Q_i$ is high.

In case (1), CLKb is high, so the input node N24 and output node N25 of the first inverter 25 are interconnected through the third analog switch 23. The output of the AND gate 31 is low, so the switching transistor 33 is in the off state and the threshold control circuit 30 does not affect the operation of the first inverter 25.

Figure 3:
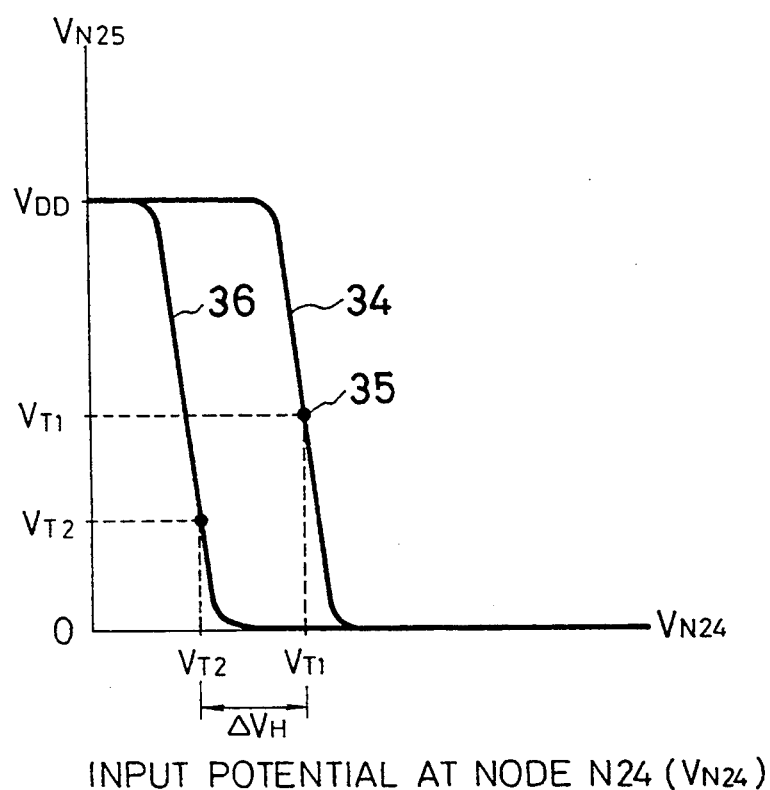
FIG. 3 illustrates transfer characteristics of the first inverter in FIG. 2.

The transfer characteristic of the first inverter 25 when the switching transistor 33 is switched off is shown as a curve 34 in FIG. 3. The input potential $V_{N24}$ at node N24 is shown on the horizontal axis, and the output potential $V_{N25}$ at node N25 on the vertical axis. With nodes N24 and N25 interconnected, the first inverter 25 necessarily operates at the point 35 on this curve at which $V_{N24}$ and $V_{N25}$ are equal to the same value $V_{T1}$.

The value of $V_{T1}$ depends on the conductance coefficients of the transistors 28 and 29. If the conductance coefficients of these two transistors are equal, then $V_{T1}$ is $V_{DD}/2$, as shown in the drawing. If the pull-down transistor 29 has a higher conductance coefficient than the pull-up transistor 28, then $V_{T1}$ is less than $V_{DD}/2$. The conductance coefficient of a field-effect transistor is substantially equal to its channel width/length ratio.

Referring again to FIG. 1, with CLKb high, the second analog switch 22 is in the on state and the potential at node N21 is $V_{ref}$, while the potential at node N24 is $V_{T1}$ as explained above. The voltage $V_C$ across capacitor 24 is therefore given by the equation below. The capacitor 24 charges to this voltage $V_C$ through the analog switches 22 and 23.

$$V_C = V_{T1} - V_{ref}$$

In case (2), when CLKa goes high and CLKb goes low the analog switches 22 and 23 turn off, so the capacitor 24 is no longer free to charge or discharge, and the voltage $V_C$ across it remains as given by the equation above. Analog switch 21 is in the on state, so the potential at node N21 is $V_{in}$ and the potential at node N24 is:

$$V_{N24} = V_{in} + V_C = V_{in} - V_{ref} + V_{T1}$$

Since $Q_i$ is low, the output of the AND gate 31 is low, the switching transistor 33 is off, and the first inverter 25 remains unaffected by the threshold control circuit 30. If $V_{in} > V_{ref}$, then from the equation above, $V_{N24} > V_{T1}$. From curve 34 in FIG. 3 it follows that $V_{N25} < V_{T1}$; in fact, unless $V_{in}$ is very close to $V_{ref}$, the output potential $V_{N25}$ will be close to ground, and will be interpreted as a logic zero. Similarly, if $V_{in} < V_{ref}$, then $V_{N24} < V_{T1}$, so $V_{N25} > V_{T1}$; unless $V_{in}$ is very close to $V_{ref}$, the output voltage $V_{n25}$ will be close to $V_{DD}$ and will be interpreted as a logic one.

In this state, the voltage $V_{T1}$ can be described as the threshold voltage of the first inverter 25, because the output potential $V_{N25}$ of the first inverter 25 goes to the logic zero or one level depending on whether the input potential $V_{N24}$ is greater than or less than $V_{T1}$, with only a small zone of ambiguity around $V_{T1}$.

In case (3) CLKa and $Q_i$ are both high, so the output of the AND gate 31 is high and the switching transistor 33 is in the on state. Referring to FIG. 1, the output potential at node N25 is pulled up toward $V_{DD}$ though the PMOS transistor 28, but is now pulled down toward ground on two parallel paths, one through the NMOS transistor 29 and another through the NMOS transistors 32 and 33.

The gate electrodes of NMOS transistors 29 and 33 are both at the potential of the input node N24. These two transistors 29 and 33 accordingly operate as if they were a single transistor with a channel width equal to the sum of their separate channel widths. The transfer characteristic of the first inverter 25 is therefore shifted to the left, e.g. to curve 36 in FIG. 3, and the threshold voltage becomes $V_{T2}$, which is less than $V_{T1}$. If the difference between $V_{T1}$ and $V_{T2}$ is $\Delta V_H$, then $$V_{T1} = V_{T2} + \Delta V_H$$

From the preceding equations, it follows that in case (3), $$V_{N24} = V_{in} - V_{ref} + V_{T1} = V_{in} - (V_{ref} - \Delta V_H) + V_{T2}$$

The output level of the inverter 25 now depends on whether $V_{in}$ is greater or less than $V_{ref} - \Delta V_H$. Suppose that $V_{in} > V_{ref} - \Delta V_H$. Then $V_{N24} > V_{T2}$, so from curve 36 in FIG. 3, $V_{N25}$ will be a logic zero (even if $V_{in}$ is very close to $V_{ref} - \Delta V_H$). If $V_{in} < V_{ref} - \Delta V_H$, then $V_{N24} > V_{T2}$, so $V_{N25}$ will be a logic one (unless $V_{in}$ is very close to $V_{ref} - \Delta V_H$).

Figure 4:
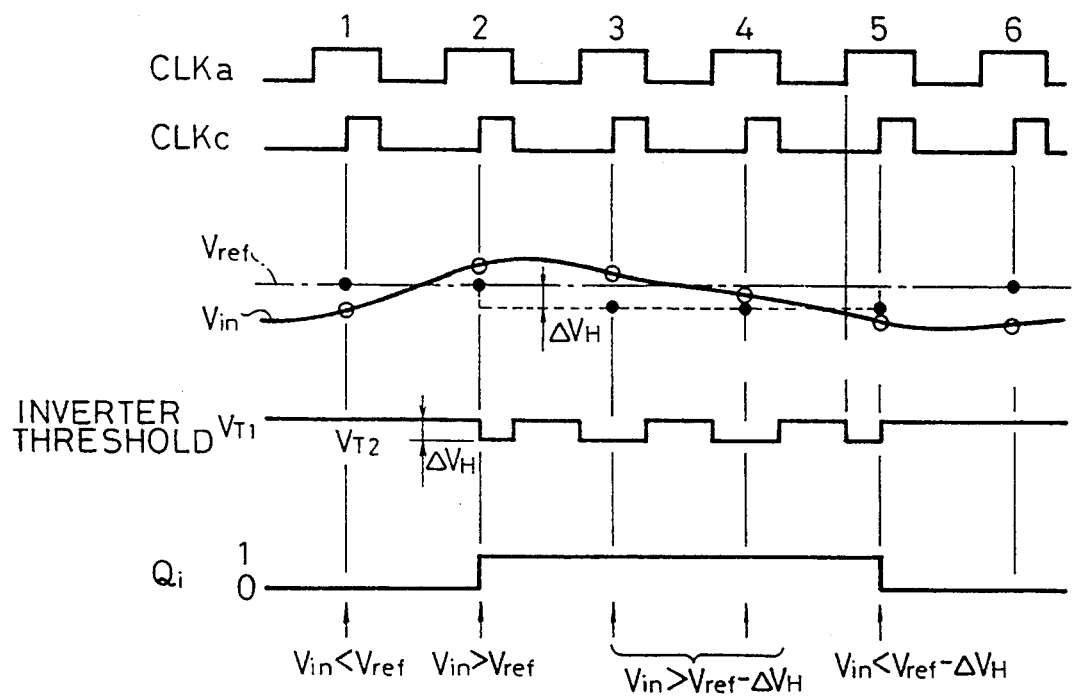
FIG. 4 is a timing diagram illustrating the operation of the comparator circuit in FIG. 2.

Next, the operation of the comparator will be described with reference to the timing diagram in FIG. 4, which shows waveforms of CLKa, CLKc, $V_{ref}$, $V_{in}$, $Q_i$, and the threshold voltage of the first inverter 25 during six clock cycles. The initial value of $Q_i$ is assumed to be logic zero (low).

In each clock cycle, CLKa goes high, then CLKc goes high, then CLKa anti CLKc simultaneously go low. The output $Q_i$ can change only while CLKc is high.

In the first clock cycle (1), when CLKa goes high the output $Q_i$ is a logic zero, so the first inverter 25 operates as in case (2) above. $V_{in}$ is less than $V_{ref}$, so the output of the first inverter 25 is a logic one and the output of the second inverter 26 is a logic zero. This state continues during the interval while CLKc is high, so the output $Q_i$ remains at the logic zero level.

In the second clock cycle (2) Vin rises above $V_{ref}$, causing the output of the first inverter 25 to reverse to logic zero and the output of the second inverter 26 to reverse to logic one. As soon as CLKc goes high, the output $Q_i$ changes from logic zero to logic one. The first inverter 25 then immediately begins operating as in case (3) above, its threshold voltage falling from $V_{T1}$ to $V_{T2}$ so that $V_{in}$ is compared with $V_{ref}-\Delta V_H$. Since $V_{in}$ exceeds $V_{ref}$, it exceeds $V_{ref}-\Delta V_H$ by an even greater amount; the output of the first inverter 25 remains low, and $Q_i$ remains at the logic one level.

In the third clock cycle (3), during the interval while CLKc is high, $V_{in}$ approaches $V_{ref}$, but the first inverter 25 continues to operate as in case (3). $V_{in}$ is much higher than $V_{ref}-\Delta V_H$, so the output of the first inverter 25 remains a logic zero and $Q_i$ remains a logic one.

In the fourth clock cycle, in the interval while CLKc is high, $V_{in}$ moves below $V_{ref}$ but remains above $V_{ref}-\Delta V_H$. From curve 36 in FIG. 3, although the output $V_{N25}$ of the first inverter 25 may rise somewhat toward $V_{T2}$, it is still interpreted as a logic zero, so $Q_i$ remains a logic one.

In the fifth clock cycle $V_{in}$ falls below $V_{ref}-\Delta V_H$, and the output of the first inverter 25 changes to a logic one. When CLKc goes high, $Q_i$ therefore changes to a logic zero. The first inverter 25 immediately resumes operating as in case (2), its threshold voltage reverting to $V_{T1}$ so that $V_{in}$ is compared with $V_{ref}$. Since $V_{in}$ is already below $V_{ref}-\Delta V_H$, it considerably below $V_{ref}$, the output of the first inverter 25 remains a logic one, and $Q_i$ remains a logic zero.

In the sixth clock cycle $V_{in}$ remains below $V_{ref}$, and $Q_i$ remains at the logic zero level.

Figure 5:
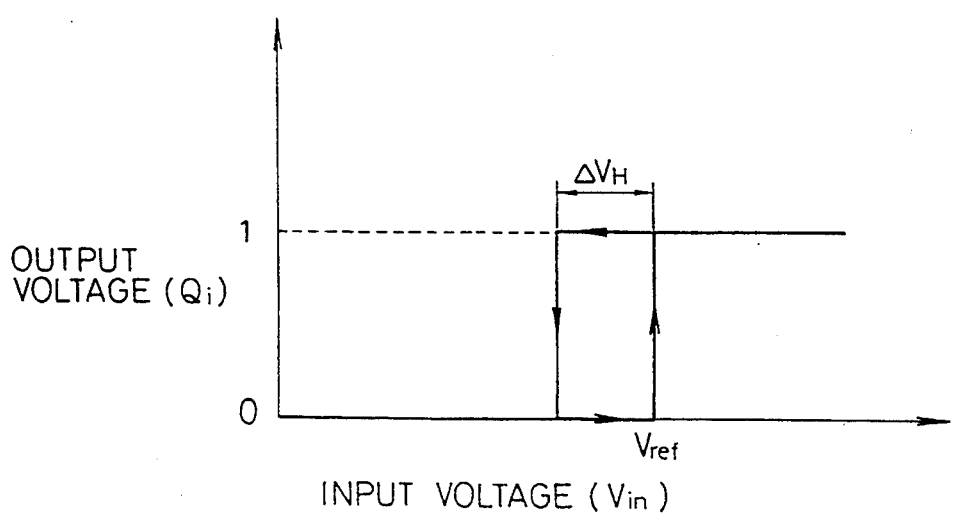
FIG. 5 illustrates the transfer characteristic of the comparator circuit in FIG. 2.

FIG. 5 summarizes the transfer characteristic of the comparator in FIG. 2. When the input voltage $V_{in}$ is rising, the output signal $Q_i$ remains at the logic zero level until $V_{in}$ reaches $V_{ref}$, at which point the output $Q_i$ changes to a logic one. When the input voltage $V_{in}$ is falling, the output signal $Q_i$ remains at the logic one level until $V_{in}$ reaches $V_{ref}-\Delta V_H$, at which point $Q_i$ changes to a logic zero. That is, the comparator has a hysteresis characteristic, with a hysteresis width $\Delta V_H$.

Figure 6:
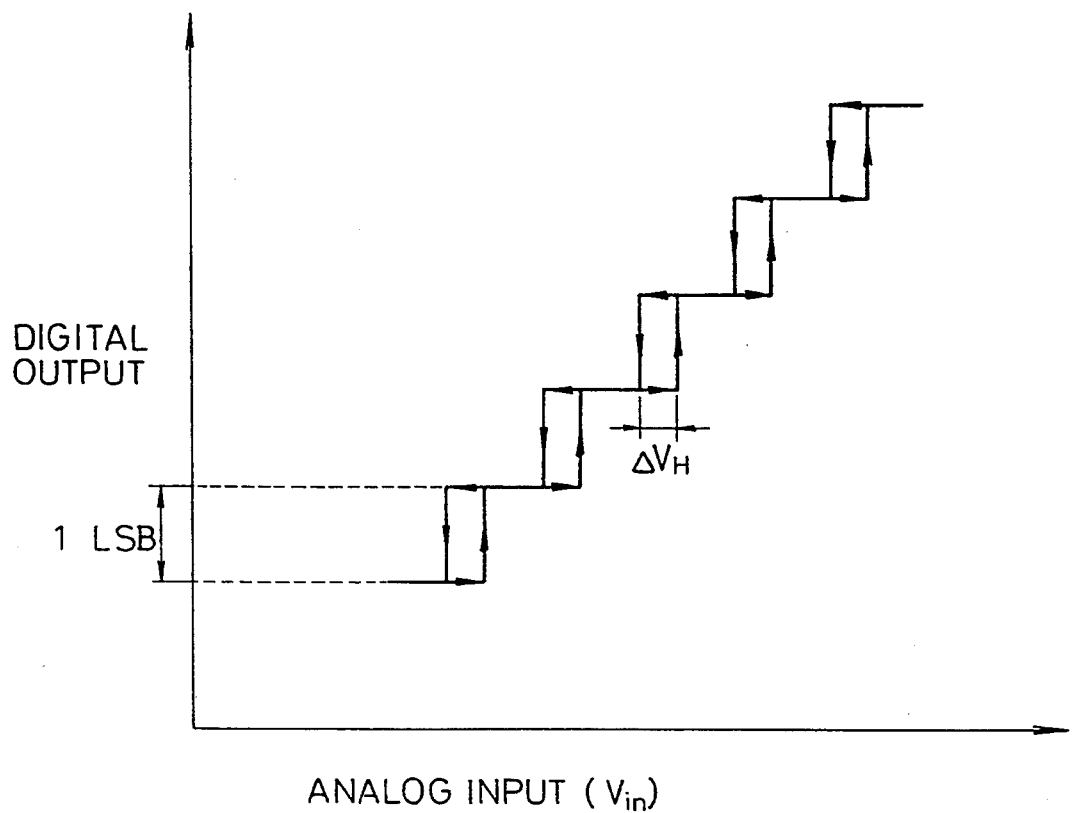
FIG. 6 illustrates the transfer characteristic of the A/D converter in FIG. 1.

FIG. 6 illustrates the transfer characteristic of the invented flash A/D converter, showing the analog input voltage Vin on the horizontal axis and the digital output value on the vertical axis. The transfer characteristic is a staircase function with a step height of one LSB. Because of the hysteresis of each comparator $2_i$ in FIG. 1, the staircase function has a hysteresis width of $\Delta V_H$ at each step. Accordingly, even if the input signal $V_{in}$ hovers around one of the internal reference voltages $V_i$ in FIG. 1, or around $V_i-\Delta V_H$, the digital output signal will not oscillate between two adjacent values; it will move to one value or the other and stay there. This solves the problem of one-LSB instability that occurs in CMOS flash A/D converters of conventional design.

As a specific example of the hysteresis width, suppose that the external reference voltage $V_R$ is five volts, and the channel width/length ratio of the NMOS transistor 32 in FIG. 2 is 100/1; then $\Delta V_H$ is approximately 5 mV, or 0.1% of the full-scale value (5 V). This hysteresis width is suitable for flash A/D converters providing up to nine-bit output. For a nine-bit A/D converter with five volts full-scale, one LSB is approximately 10 mV (0.2% of full-scale).

Figure 7:
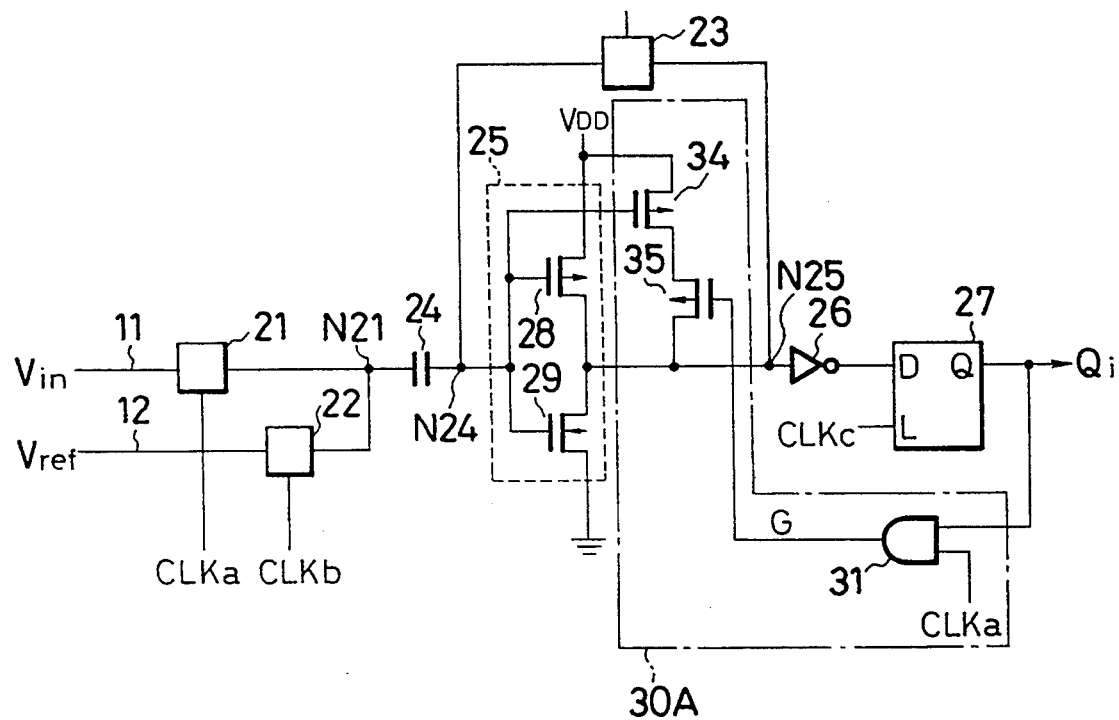
FIG. 7 shows a modification of the circuit in FIG. 2.

FIG. 7 shows a variation of the comparator circuit described above. Elements identical to elements in FIG. 2 have the same reference numerals. The threshold control circuit 30A now comprises the AND gate 31 and a pair of PMOS transistors, namely a second pull-up transistor 34 and a switching transistor 35 coupled in series between node N25 and the power supply $V_{DD}$. The gate electrode of the second pull-up transistor 34 is coupled to node N24; the gate electrode of the switching transistor 35 receives the gate signal G output by the AND gate 31. The switching transistor 35 turns on when the gate signal G is low.

If CLKa is low, or if CLKa is high but $Q_i$ is low, then the switching transistor 35 is on, transistors 28 and 34 act as one combined pull-up transistor, and the first inverter 25 operates with a certain first threshold voltage. The capacitor 24 charges to the potential difference between this first threshold and $V_{ref}$, and $V_{in}$ is compared with $V_{ref}$.

If CLKa is high and $Q_i$ is also high, the switching transistor 35 turns off, decoupling the threshold control circuit 30A from the first inverter 25, and the first inverter 25 operates with a second, lower threshold voltage. If $\Delta V_H$ is the difference between the first and second threshold voltages, then $V_{in}$ is compared with $V_{ref}-\Delta V_H$.

These relationships are exactly the same as for the comparator in FIG. 2, the first threshold voltage now being $V_{T1}+\Delta V_H$ and the second threshold voltage being $V_{T1}$. Accordingly, the comparator in FIG. 7 operates like the comparator in FIG. 2, with a hysteresis characteristic as shown in FIG. 5. A flash A/D converter comprising comparators of the type shown in FIG. 7 will have the same transfer characteristic as in FIG. 6, with a hysteresis width $\Delta V_H$.

The order in which the NMOS transistors 32 and 33 in FIG. 2 are connected between node N25 and ground, or the PMOS transistors 34 and 35 in FIG. 7 between node n25 and $V_{DD}$, need not be the order shown. The positions of transistors 32 and 33, or of transistors 34 and 35, can obviously be interchanged without altering the effect of the invention. Those skilled in the art will recognize that the invention can be practiced not only in a flash A/D converter, but also in a so-called multistep or subranging A/D converter in which a flash A/D converter is cascaded with, for example, another flash A/D converter, and that further modifications can be made to the circuit configuration of the threshold control circuit 30 or threshold control circuit 30A, or to other circuits shown in FIGS. 1, 2, and 7, without departing from the scope of the invention as set forth in the following claims.

What is claimed is:

1. An A/D converter comprising;
   a plurality of resistors for dividing an external reference voltage to generate a plurality of internal reference voltages;
   a plurality of CMOS comparators having hysteresis effect, for comparing an analog input signal with respective ones of the internal reference voltages and producing internal output signals;
   each CMOS comparator comprising;

a first inverter having an input node and an output node, for generating a logic level at said output node from a potential at said input node according to a certain threshold voltage;

a capacitor coupled between said input node and a signal node;

a first analog switch coupled to supply said analog input signal to said signal node, said first analog switch being operated in response to a clock signal;

a second analog switch, operating in complementary fashion to said first analog switch, coupled to supply one internal reference voltage from among said plurality of internal reference voltage to said signal node;

a third analog switch, operating in complementary fashion to said first analog switch, for coupling said input node to said output node;

a latch coupled to said output node for generating an output signal responsive to the logic level at said output node, said output signal being one of said internal output signals; and a threshold control circuit coupled to said output node for controlling the threshold voltage in response to a signal appearing on said input node, the clock signal and the output signal, said threshold control circuit including a logic gate coupled to receive the output signal and the clock signal and generating a gate signal, a first transistor having a gate electrode coupled to said logic gate and a second transistor having a gate electrode coupled to said input node and connected in series with said first transistor between said output node and an electric potential source.

2. The A/D converter according to claim 1, wherein said threshold control circuit controls said latch and said logic gate to provide said first inverter with a hysteresis effect only when the first transistor turns on.

3. The A/D converter according to claim 1, wherein said electric potential source is a power-supply.

4. The A/D converter according to claim 1, wherein said electric potential source is a ground.

* * * * *